(12) United States Patent
Imahashi

(10) Patent No.: US 6,284,668 B1
(45) Date of Patent: Sep. 4, 2001

(54) PLASMA POLISHING METHOD

(75) Inventor: Issei Imahashi, Yamanashi-ken (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/495,863

(22) Filed: Feb. 2, 2000

Related U.S. Application Data

(62) Division of application No. 08/683,651, filed on Jul. 15, 1996, now abandoned.

(30) Foreign Application Priority Data

| Aug. 10, 1995 | (JP) | 7-225797 |
| Jul. 10, 1996 | (JP) | 8-199863 |

(51) Int. Cl.[7] ............................................. H01L 21/302
(52) U.S. Cl. .............................. 438/716; 438/710; 216/38
(58) Field of Search ........................ 438/710, 711, 438/714, 716, 729; 216/38

(56) References Cited

U.S. PATENT DOCUMENTS

| 4,863,501 | * | 9/1989 | Mansfield | 65/3.11 |
| 5,345,690 | * | 9/1994 | McMurtry et al. | 33/561 |
| 5,376,224 | * | 12/1994 | Zarowin | 156/643 |
| 5,431,769 | * | 7/1995 | Kisakibaru et al. | 156/345 |
| 5,468,326 | * | 11/1995 | Cuomo et al. | 156/345 |
| 5,628,829 | * | 5/1997 | Foster et al. | 118/723 |
| 5,630,881 | * | 5/1997 | Ogure et al. | 118/730 |
| 6,013,191 | * | 1/2000 | Nasser-Faili et al. | 216/67 |

OTHER PUBLICATIONS

Plasma Jet Etching, Technology and Equipment, 4 pages, "Silicon Wafer Thinning & Isotropical Etching Atmospheric Pressure" No Date Available.

* cited by examiner

*Primary Examiner*—Gregory Mills
*Assistant Examiner*—Luz L. Alejandro
(74) *Attorney, Agent, or Firm*—Oblon, Spivak, McClelland, Maier & Neustadt, P.C.

(57) ABSTRACT

A plasma polishing apparatus has a table which holds a wafer and is rotated at a high speed by a drive base. The drive base is supported on a horizontal drive stage, so that the table is linearly and reciprocally movable. A plasma generator for converting a process gas into a plasma by high-frequency inductive coupling is arranged above the table. The plasma generator has an outlet port from which the plasma flows out toward the target surface of the wafer. The plasma from the outlet port is drawn upon high-speed rotation of the wafer, diffused as a laminar flow on the target surface of the wafer, and uniformly polishes the entire target surface.

22 Claims, 6 Drawing Sheets

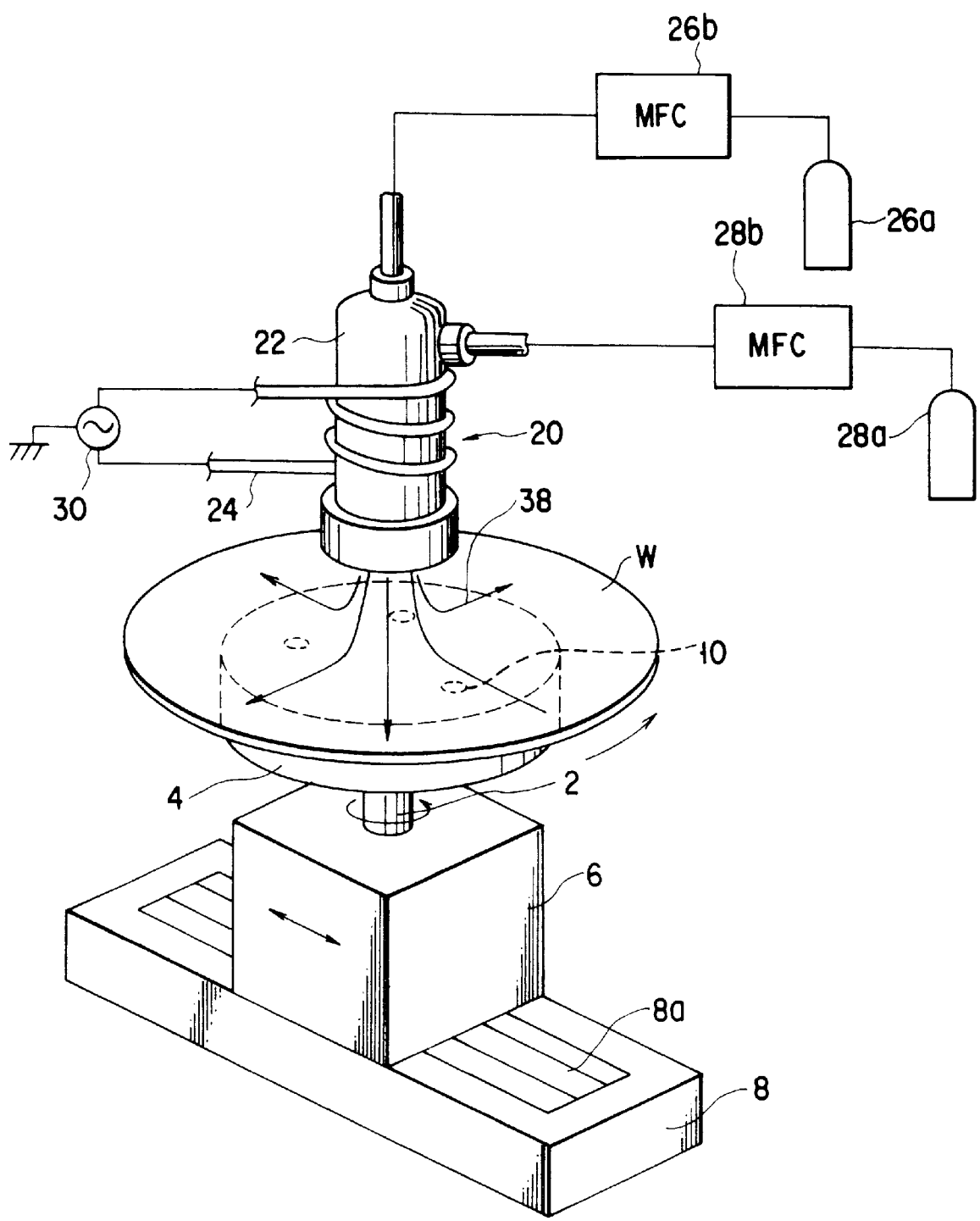
F I G. 2

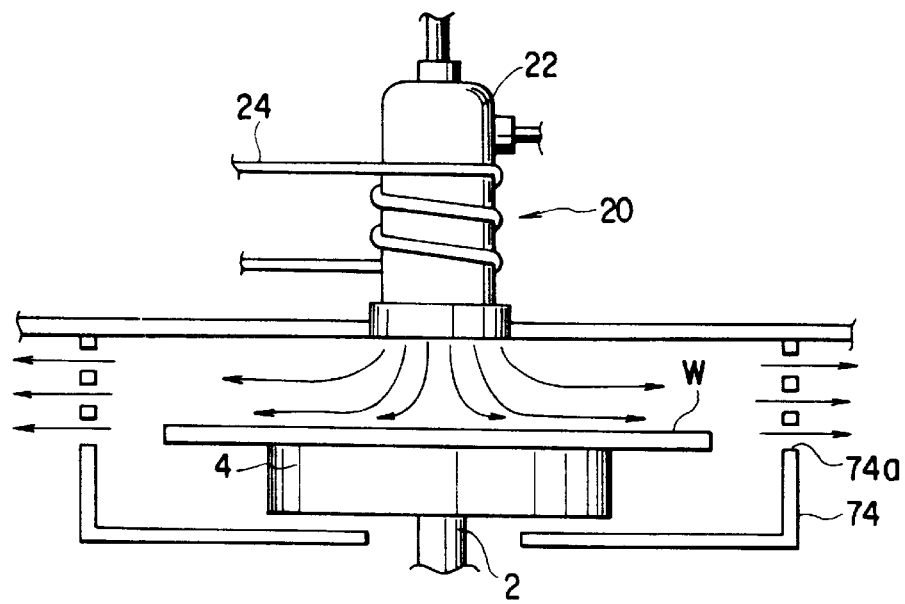
F I G. 10

PLASMA POLISHING METHOD

This application is a Division of application Ser. No. 08/683,651 filed on Jul. 15, 1996 now abandoned

BACKGROUND OF THE INVENTION

1. Field of the Invention

The present invention relates to a plasma polishing apparatus and a plasma polishing method in a semiconductor process and, more particularly to, a dry polishing apparatus and a dry polishing method of polishing a target object by a plasma without using a polishing solution.

2. Description of the Related Art

In manufacturing processes for semiconductor devices and liquid crystal displays, the surfaces of target objects are polished to reduce irregularity on the surfaces of the target objects such as semiconductor wafers and LCD substrates. As representative polishing of this type, a so-called CMP (Chemical Mechanical Polishing) method is known in which the surface of a target object is mechanically polished using a chemical polishing solution, a pad, and so forth.

FIGS. 11 and 12 show an example of a conventional CMP apparatus. This CMP apparatus comprises a rotary table 104 having a polishing pad 102 arranged on its surface. A wafer holder 106 rotated by a motor 112 (FIG. 12) is arranged above the table 104. A nozzle 108 for supplying the slurry of a chemical polishing solution containing, e.g., silica as a main component is arranged above the surface of the polishing pad 102.

In polishing, a wafer W as a target object is held by the holder 106 and pressed against the pad 102 at a predetermined pressure. In this state, both the table 104 and the holder 106 are rotated, and a polishing solution is supplied from the nozzle 108. In this manner, the surface of the wafer W is polished a friction among the chemical polishing solution, the pad 102 and the surface of the wafer W.

Since the above-described CMP apparatus, however, polishes the wafer in a wet atmosphere by using a chemical polishing solution, it requires a scattering prevention mechanism for a polishing solution and a recovery mechanism for a waste solution. In addition, this CMP apparatus must perform the post-process step of cleaning a wafer after it is polished.

Since the polishing pad is pressed against the surface of a wafer in the above-described CMP apparatus, a progress of polishing the wafer surface cannot be directly observed. It is therefore difficult to detect the end of polishing. Further, this CMP apparatus uses many control parameters such as the pressure, the rotational speeds of the rotary table and the wafer holder, the supply amount of a polishing solution, and the polishing time, so that a wealth of experiences and know-how are required to perform optimum polishing.

SUMMARY OF THE INVENTION

It is an object of the present invention to provide a new polishing apparatus and method capable of polishing a target object in a dry atmosphere at substantially the atmospheric pressure using no polishing solution.

According to a first aspect of the present invention, there is provided a plasma polishing apparatus for polishing a surface of a target object, comprising:

a plasma generator for converting a process gas into a plasma, the plasma generator having an outlet port from which the plasma flows out, the outlet port being substantially smaller than the surface;

a table for holding the target object so as to position the surface of the target object opposite to the outlet port; and a rotary driver for rotating the table together with the target object at a high speed, such that the plasma is drawn and diffused in a laminar flow state on the surface of the target object by a centrifugal force generated upon rotation of the surface, and polishes the surface during diffusion on the surface.

According to a second aspect of the present invention, there is provided a plasma polishing method of polishing a surface of a target object, comprising the steps of:

holding the target object by a table so as to expose the surface of the target object;

converting a process gas into a plasma and supplying the plasma onto the surface from an outlet port substantially smaller than the surface of the target object; and rotating the table together with the target object at a high speed, such that the plasma is drawn and diffused in a laminar flow state on the surface of the target object by a centrifugal force generated upon rotation of the surface, and polishes the surface during diffusion on the surface.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 2 is a schematic perspective view of the plasma polishing apparatus shown in FIG. 1;

FIG. 10 is a schematic view showing another modification of the plasma polishing apparatus shown in FIG. 1;

DETAILED DESCRIPTION OF THE PREFERRED EMBODIMENTS

Figure 1:
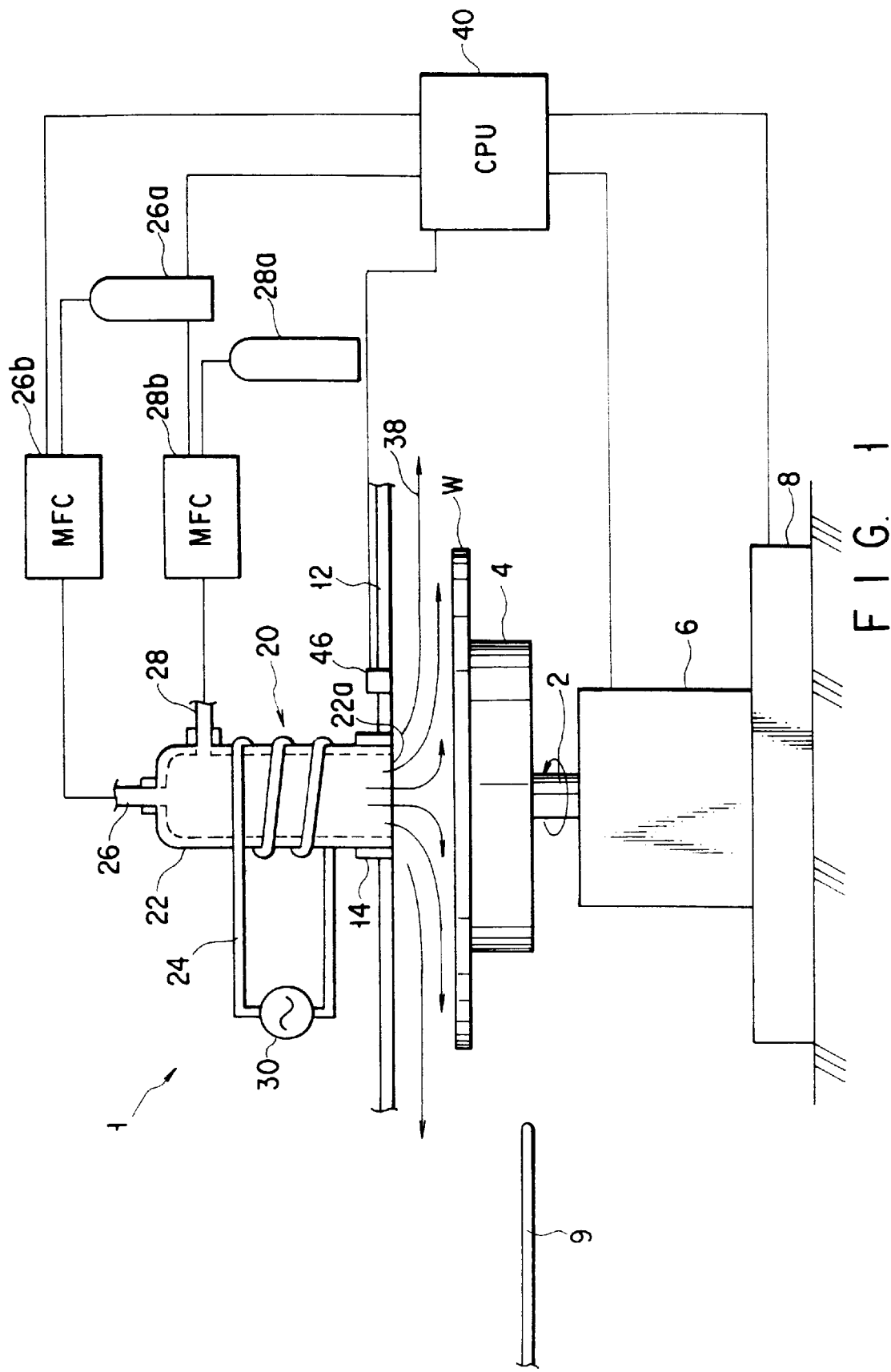
FIG. 1 is a schematic view showing a plasma polishing apparatus according to an embodiment of the present invention.

As shown in FIGS. 1 and 2, a plasma polishing apparatus 1 for wafers, according to an embodiment of the present invention, has a rotary table 4 for holding and fixing a wafer W. For example, the rotary table 4 is circular and smaller in diameter than the wafer W. A means for holding the wafer W, e.g., a vacuum chuck 10 is arranged on the support surface of the table 4. Even when the wafer W is rotated at a high speed of, e.g., 5,000 rpm, the vacuum chuck 10 can firmly fix the wafer W to the table 4.

The table 4 is fixed to a rotating shaft 2 vertically mounted on a drive base 6. The table 4 is rotatable at a high speed of, e.g., 5,000 rpm through the shaft 2 by a rotation drive source, such as a motor, incorporated in the drive base 6. The table 4 is vertically movable through the shaft 2 by a vertically drive source, such as an air cylinder, incorporated in the drive base 6.

When the wafer W is loaded/unloaded on/from the table 4, the table 4 is moved down to a lower or transfer position. In this state, the wafer W is transferred between the table 4 and a transfer arm 9. In polishing the wafer W. the table 4 is moved up to an upper or polishing position to set the interval between the wafer W and a top plate 12 (to be described later) optimum.

The drive base 6 is attached to be movable along a rail 8a (see FIG. 2) formed on a horizontal drive stage 8. The drive base 6 is reciprocally moved along the rail 8a by a horizontal drive source, such as a ball screw mechanism, incorporated in the horizontal drive stage 8. In wafer polishing, the drive base 6 is moved horizontally to move the rotation center of the table 4 in a horizontal direction.

Both the drive base 6 and the horizontal drive stage 8 are connected to a control means such as a CPU 40. The drive base 6 and the horizontal drive stage 8 are operated in accordance with an arbitrary program input to the CPU 40.

The top plate 12 is arranged above the support surface of the table 4 (or the target surface of the wafer W, i.e., that surface of the wafer W which is to be polished) so as to be substantially parallel to the support surface (or the target surface of the wafer W).

A plasma generator 20 is arranged at substantially the center of the top plate 12, i.e., on substantially the extension line of the rotation center of the table 4 positioned at the center of the horizontal drive stage 8.

The plasma generator 20 is called a plasma torch and has a plasma chamber 22 consisting of a dielectric material such as quartz or silicon carbide. A high-frequency antenna 24 is wound several turns on the outer side of the plasma chamber 22. The plasma chamber 22 has a hollow cylindrical shape in which the lower end (wafer W side) is open and the upper end is closed. The lower end of the plasma chamber 22 extends through the top plate 12, and a plasma outlet port 22a of the plasma chamber 22 faces the target surface of the wafer W, so as to be aligned with the lower surface of the top plate 12. The plasma chamber 22 and the top plate 12 are airtightly connected to each other by a seal member 14.

The relationship between the table 4, the wafer W, and the plasma generator 20 is set to cause the following phenomenon. That is, a plasma generated by the plasma generator 20 flows as a plasma flow from the plasma outlet port 22a onto the target surface of the wafer W. This plasma flow is drawn by a centrifugal force generated on the target surface upon rotation of the wafer W, becomes a laminar flow, and uniformly flows on the target surface of the wafer W toward the circumference of the wafer W.

First and second process gas supply systems 26 and 28 are airtightly connected to the upper portions of the plasma chamber 22 through proper gaskets. The first process gas supply system 26 is connected to a gas source 26a of an inactive gas, such as argon, for exciting a plasma. The inactive gas from the gas source 26a is supplied to the plasma chamber 22 through a flow controller, i.e., a gas mass-flow controller (MFC) 26b.

The second process gas supply system 28 is connected to a gas source 28a of an etchant gas. The etchant gas from the gas source 28a is supplied to the plasma chamber 22 through a flow controller, i.e., a gas mass-flow controller (MFC) 28b. A proper etchant gas can be selected in accordance with the material of a target surface to be polished. For example, when a silicon oxide film is to be smoothened, a fluorine-based gas can be used as an etchant gas. When a metal film of, e.g., tungsten or aluminum is to be smoothened, a chlorine-based gas can be used as an etchant gas.

Both the MFCs 26b and 28b are connected to a control means such as the CPU 40. The MFCs 26b and 28b are operated in accordance with an arbitrary program input to the CPU 40 to supply the inactive and etchant gases at predetermined flow rates, respectively.

Note that, in the embodiment shown in FIGS. 1 and 2, the inactive and etchant gases are introduced into the plasma chamber 22 through different paths. It is also possible to mix these gases in an introduction path and introduce the gas mixture into the plasma chamber 22. If the etchant gas is unnecessary, it is also possible to convert only the inactive gas into a plasma and perform polishing with only, e.g., an argon plasma.

The high-frequency antenna 24 wound on the plasma chamber 22 is formed of a copper wire in a coiled shape of about three turns. A high-frequency power supply 30 is connected to the high-frequency antenna 24 through a proper matching circuit (not shown). The high-frequency power supply 30 can apply a high frequency of, e.g., 13.56 MHz to the antenna 24.

Figure 3:
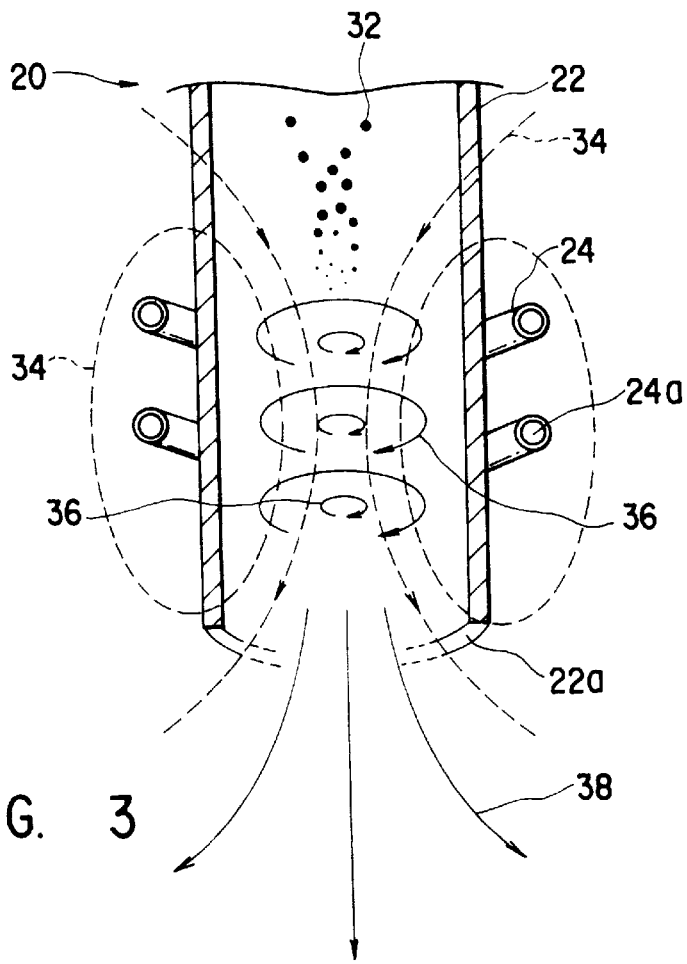
FIG. 3 is an explanatory view showing a plasma generation mechanism in a plasma generator of the plasma polishing apparatus shown in FIG. 1.

The number of turns and the shape of the high-frequency antenna 24 can be arbitrarily set within the scope of design. In short, an alternating magnetic field should be formed in the plasma chamber 22 by a high frequency applied to the antenna 24 so as to generate a plasma. For example, the plate-like antenna 24 can be used instead. In addition, the antenna 24 is heated by applying a high frequency. For this reason, it is also possible to employ a hollow coil constituted as the high-frequency antenna 24 to flow cooling water through a bore 24a, as shown in FIG. 3.

A plasma generation mechanism by the plasma generator 20 will be described in short with reference to FIG. 3.

The plasma generator 20 generates a plasma by using high-frequency inductive coupling. At this time, a process gas 32 such as an inactive gas and an etchant gas is flowed through the plasma chamber 22. For example, the flow rate of the etchant gas is set to be 1% to 2% the total process gas. A high frequency of, e.g., 13.56 MHz is applied to the antenna (induction coil) 24. Due to this high frequency, an alternating magnetic field as indicated by dotted lines 34 in FIG. 3 is generated so that electric fields 36 are generated around the magnetic fluxes and electrons are accelerated. The electrons accelerated at this time collide with the atoms of the process gas 32 to cause plasma discharge.

The generated plasma is supplied as a plasma flow 38 from the outlet port 22a of the plasma chamber 22 to the target surface of the wafer W placed on the rotary table 4, as shown in FIGS. 1 and 2. The plasma flow 38 is drawn by a centrifugal force generated upon rotation of the wafer W and flows as a laminar flow substantially parallel to the target surface of the wafer W. While flowing toward the peripheral portion of the wafer W, the plasma flow 38 polishes and smoothens the surface of the wafer W.

During polishing the wafer W, the outlet port 22a of the plasma chamber 22 is arranged inside the edge of the wafer W. If the plasma flow 38 can be directly delivered toward a region about 1/10 the diameter of the wafer W, the plasma flow can be sufficiently diffused along the rotating surface of the wafer W by the centrifugal force generated upon rotation of the wafer W to uniformly polish the entire target surface of the wafer W.

If the rotation center of the table 4 is horizontally moved by the horizontal drive stage 8, it is possible to compensate for the density irregularity of the plasma generated by the high-frequency inductive coupling type plasma generator 20 as shown in FIG. 3. With this operation, the plasma flow flowing on the surface of the wafer W can be made uniform, and uniform polishing can be realized.

To draw the plasma flow 38 and transform it into a laminar flow during polishing the wafer W, the wafer W must be rotated at a high speed. However, if the wafer W is rotated at a speed higher than a certain value, the speed of the plasma flow 38 becomes so high that the polishing efficiency per unit supply amount of a process gas is decreased. In addition, high-speed rotation of the wafer W increases the load of the rotation drive mechanism of the table 4. For this reason, the rotational speed of the wafer W is set to 1,000 rpm to 7,000 rpm and desirably to 4,000 rpm to 6,000 rpm.

Since the wafer W is rotated at a high speed during polishing the wafer W, if the plasma flow is directly delivered toward a region about 1/10 the diameter of the wafer W, the plasma flow can be diffused in a laminar flow state over the entire region on the target surface of the wafer W. In other words, the outlet port 22a of the plasma chamber 22 has a small diameter of 1/10 or less that of the target surface of the wafer W and a small area of 1/100 or less that of the target surface of the wafer W. Further, in consideration of the plasma generation and use efficiencies, the inner diameter of the plasma chamber 22 and the diameter of the outlet port 22a preferably fall within the range of 5 mm to 30 mm and more preferably within the range of 10 mm to 20 mm. For example, if the wafer W is an 8-inch wafer (diameter: about 200 mm), the plasma chamber 22 having the outlet port 22a whose diameter is about 10 mm to 20 mm is used.

During polishing the wafer W, the distance between the target surface of the wafer W and the outlet port 22a (and the top plate 12) of the plasma chamber 22 is set such that the plasma flow 38 is drawn by a centrifugal force generated upon rotation of the wafer W and becomes a laminar flow. In consideration of the above-described desirable ranges of the diameter of the outlet port 22a and the rotational speed of the wafer W, the distance desirably falls within 50 mm or less and more desirably within 5 mm to 30 mm.

During polishing the wafer W, a plasma flow is desirably diffused in a laminar flow state over the entire region on the target surface of the wafer W. If the rotation center of the table 4 is kept present within the diameter of the outlet port 22a of the plasma generator 20, a region is undesirably formed where the plasma flow is not diffused in a laminar flow state. For this reason, the drive base 6 is desirably moved along the rail 8a of the horizontal drive stage 8 together with rotation of the wafer W. With this operation, the outlet port 22a of the plasma chamber 22 can scan substantially the entire target surface of the wafer W. Desirably, the drive base 6 is moved to reciprocate the outlet port 22a once in 2 sec to 4 sec in the radial direction of the wafer W.

It is desirable that the relative moving speed of the outlet port 22a with respect to the target surface of the wafer W is not set constant. For example, generally, it is desirable to decrease the relative moving speed of the outlet port 22a nearer the peripheral portion of the wafer W. This is because the ratio of an area to be scanned on the wafer W relative to the area of the outlet port 22a becomes larger nearer the peripheral portion of the wafer W. In addition, for example, when irregularity on the target surface of the wafer W are measured in advance or during polishing, it is possible to decrease the relative moving speed of the outlet port 22a in a region having a high irregularity.

Figure 7:
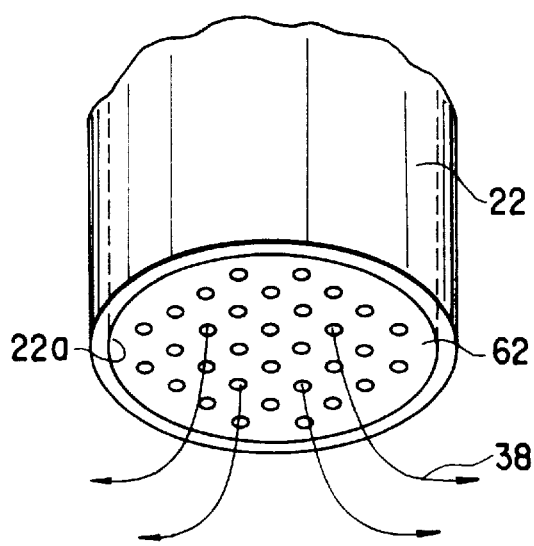
FIG. 7 is a perspective view showing a modification of a plasma outlet port of the plasma generator.
Figure 8:
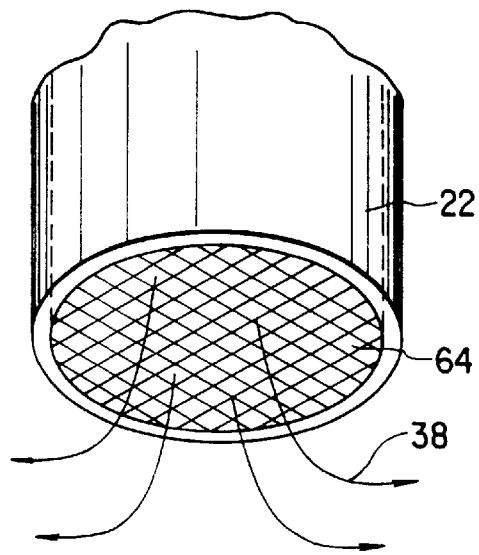
FIG. 8 is a perspective view showing another modification of the plasma outlet port of the plasma generator.

The outlet port 22a of the plasma chamber 22 can be covered with a rectifying plate having a large number of through holes formed therein. As this rectifying plate, a punching metal 62 or a mesh 64 can be used, as shown in FIGS. 7 and 8. With this rectifying plate, the uniformity of the plasma density of the plasma flow 38 flowing from the outlet port 22a is improved. The punching metal 62 or the mesh 64 must be covered with an appropriate protection film.

Since the plasma generator 20 uses high-frequency inductive coupling, it can generate an atmospheric-pressure plasma at substantially the atmospheric pressure. The atmospheric-pressure plasma has characteristics of rarely entering recessed portions in a target surface and tending to collide with projecting portions on the target surface because the mean free path of ions and electrons is shorter than that of a low-pressure plasma generated in a low-pressure atmosphere. If the atmospheric-pressure plasma having such characteristics flows as a laminar flow substantially parallel to the target surface of the wafer W, the surface of the wafer W can be efficiently smoothened with a high precision.

By using the atmospheric-pressure plasma, the wafer can be polished in the atmospheric pressure atmosphere and a dry environment. That is, polishing according to the present invention can be performed in an open space to a certain degree, compared to wet polishing. For this reason, the plasma polishing apparatus has a simpler structure than a conventional wet CMP apparatus. Further, since a target surface is not covered with a polishing pad or the like, light reflected by the surface of the wafer W can be observed in real time by, e.g., an optical sensor 46 (see FIG. 1). For this reason, an optimum end of polishing can be detected, and the precision of polishing can be further improved.

Figure 4:
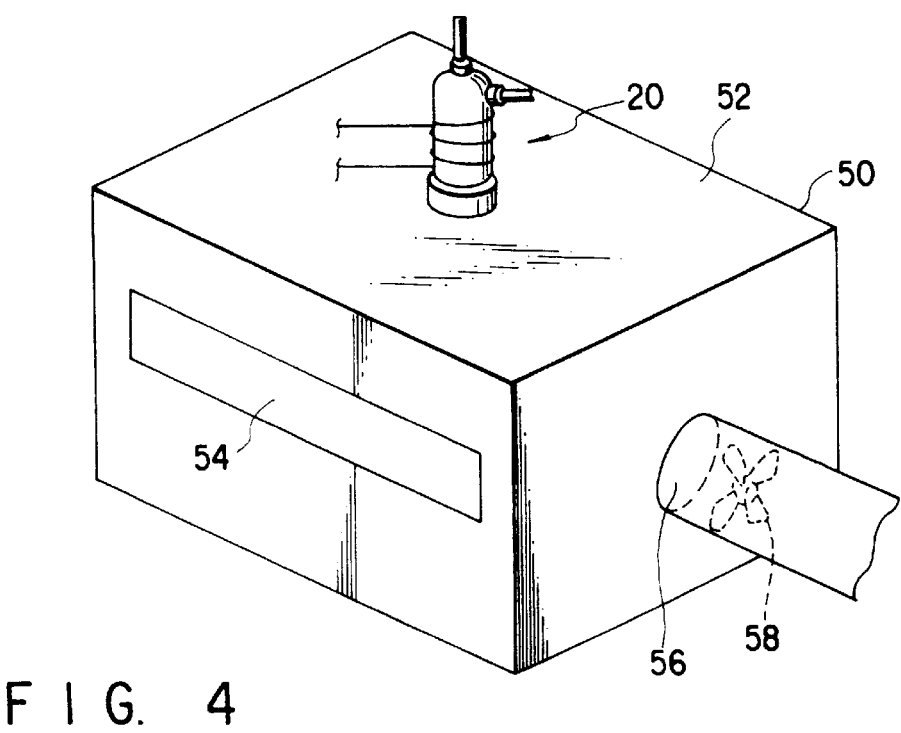
FIG. 4 is a schematic perspective view showing a process container of the plasma polishing apparatus shown in FIG. 1.

The plasma polishing apparatus 1 can be constituted as one unit having a process container 50 surrounding a process space, as shown in FIG. 4. The process container 50 has, e.g., a substantially cubic shape, and the plasma generator 20 is mounted at substantially the center of a top plate 52. A freely opening/closing opening 54 is formed in one side wall of the process container 50. The wafer W is loaded/unloaded through the opening 54 by the transfer means 9 (see FIG. 1). The process container 50 may have the shape of a circular column or cylinder.

An exhaust port 56 is formed in the other side wall of the process container 50. Since an atmospheric-pressure plasma is used, the contents are exhausted from the process container 50 by a simple exhaust means such as an exhaust fan 58. Since the process container 50 need not be evacuated to a low pressure by a vacuum pump, the polishing apparatus is simplified. If the process container 50 is standardized in a unit size, it is possible to construct a process system of the multi-container type for performing a serial-processing sequence by using the process container 50 as one of the units of the system.

Next, an operation when an interlevel insulating layer consisting of a silicon oxide film is smoothened by the plasma polishing apparatus will be described with reference to FIGS. 5A and 5B.

Figure 5A:
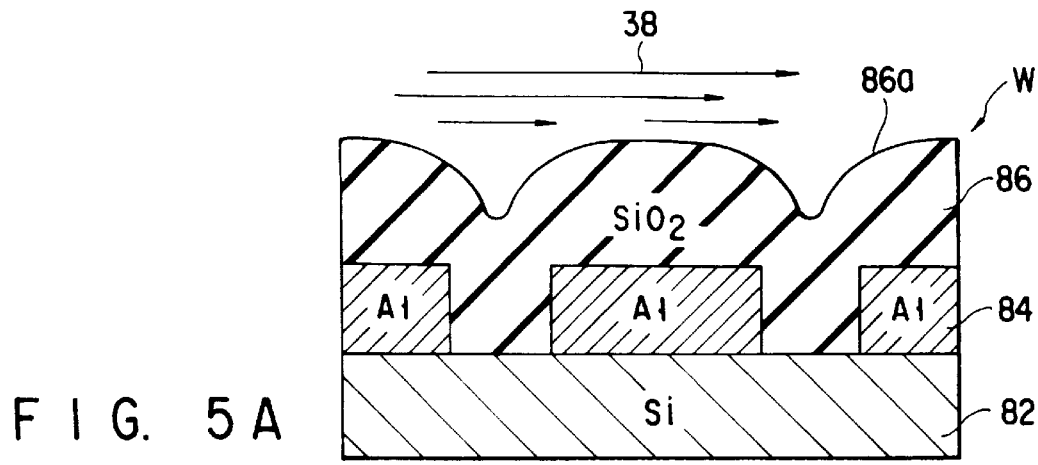
FIGS. 5A and 5B are sectional views respectively showing the surface states of a certain wafer before and after polishing.
Figure 5B:
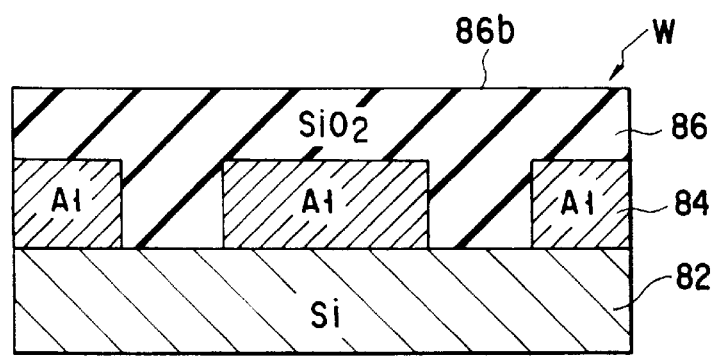

A wafer W1 shown in FIG. 5A has a metal wiring layer 84 consisting of aluminum or the like formed on a silicon layer 82, and an interlevel insulating layer 86 consisting of a silicon oxide film covering the entire wiring layer 84.

First, the table 4 is moved down to the lower or transfer position. As shown in FIG. 5A, the unprocessed wafer W1 having an uneven surface 86a is placed on the table 4 by the transfer means. The wafer W1 is attracted on the vacuum chuck 10 by vacuum suction, and the table 4 is moved up to a polishing position.

Then, the table 4 and the wafer W1 are rotated at a high speed of, e.g., 5,000 rpm. Process gases, e.g., argon gas and CF4 gas are introduced into the plasma chamber 22, and at the same time a high frequency of, e.g., 13.56 MHz is applied from the high-frequency power supply 30 to the high-frequency antenna 24, thereby generating a plasma in the plasma chamber 22.

The plasma in the plasma chamber 22 flows as the plasma flow 38 toward the surface of the wafer W1 from the opening or outlet portion 22a due to a low positive pressure in the chamber 22 and a drawing force generated upon rotation of the wafer W1. Then, the plasma flow is made as a laminar flow toward the circumference of the wafer W1 upon rotation of the wafer W1 and polishes the surface of the wafer W1 to obtain a smooth surface 86b, as shown in FIG. 5B.

The target surface of the wafer W1 is observed in real time by the optical sensor 46. When a predetermined degree of smoothness is obtained, an end signal is supplied from the optical sensor 46 to the CPU 40. Rotation and horizontal movement of the table 4, and plasma generation by the plasma generator 20 are stopped through the CPU 40 on the basis of this end signal. Thereafter, the table 4 is moved down to the transfer position, the polished wafer W1 is unloaded by the transfer means, and a series of process steps is completed.

Figure 6A:
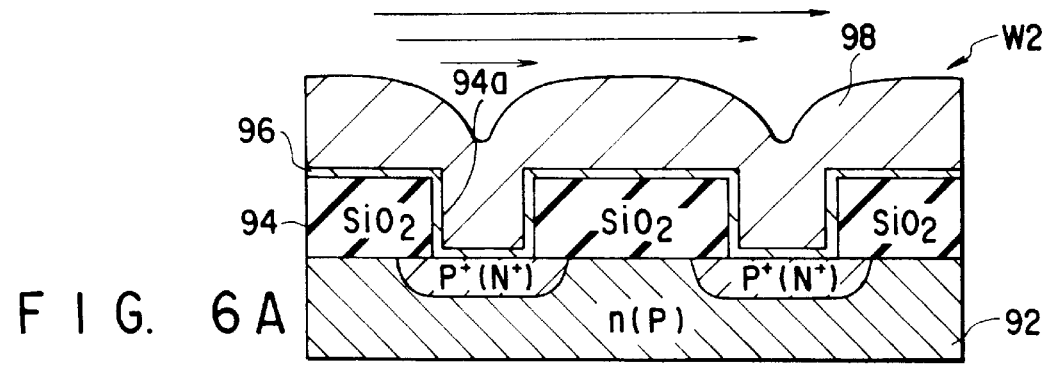
FIGS. 6A and 6B are sectional views respectively showing the surface states of another wafer before and after polishing.
Figure 6B:
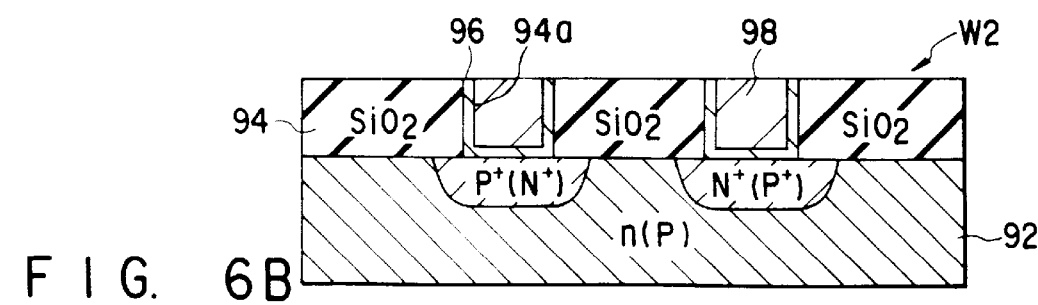

The present invention can be applied to a case in which a film such as silicon nitride film or a metal film other than a silicon oxide film is polished. FIG. 6A exemplifies the structure of a wafer in which a metal film needs to be polished. A wafer W2 shown in FIG. 6A has an insulating film 94 consisting of a silicon oxide film or the like formed on a silicon layer 92 and having contact holes 94a therein, and a metal film 98 consisting of a tungsten film or the like covering the entire insulating film 94 through a thin barrier layer 96 consisting of a titanium nitride film. The metal film 98 and the barrier layer 96 of the wafer W2 are etched back to expose the insulating film 94, as shown in FIG. 6B.

The present invention is directed to uniformly polish the entire target surface of the wafer W by forming a plasma flow as a laminar flow substantially parallel to the target surface upon rotation of the wafer W. However, when a turbulent flow generated at the peripheral portion of the wafer W adversely affects polishing, the polishing apparatus is modified as shown in FIG. 9 or 10, thereby ensuring a uniform laminar flow.

Figure 9:
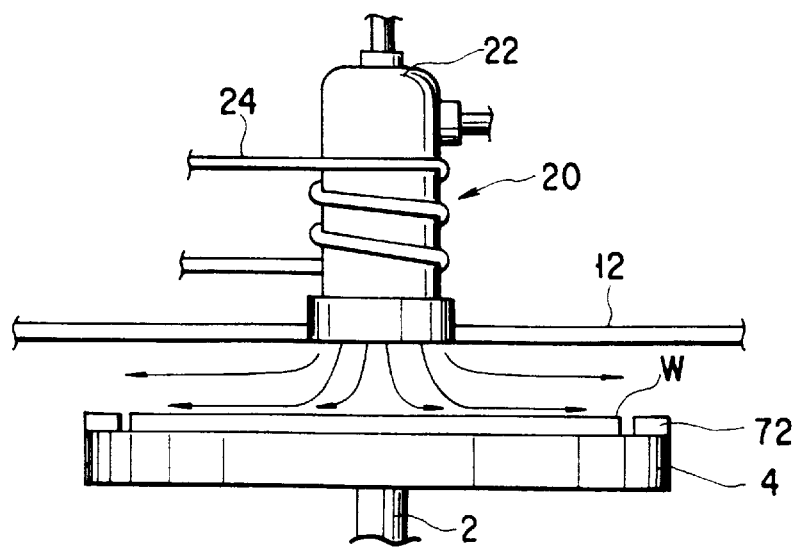
FIG. 9 is a schematic view showing a modification of the plasma polishing apparatus shown in FIG. 1.
Figure 11:
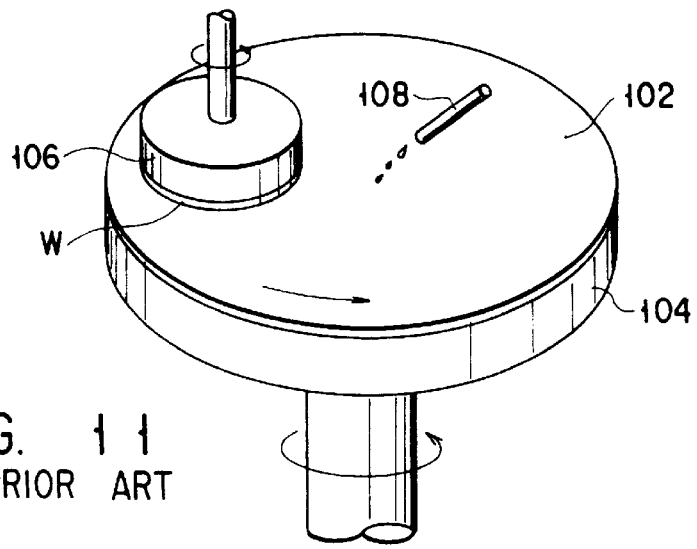
FIG. 11 is a perspective view showing a conventional CMP type polishing apparatus.
Figure 12:
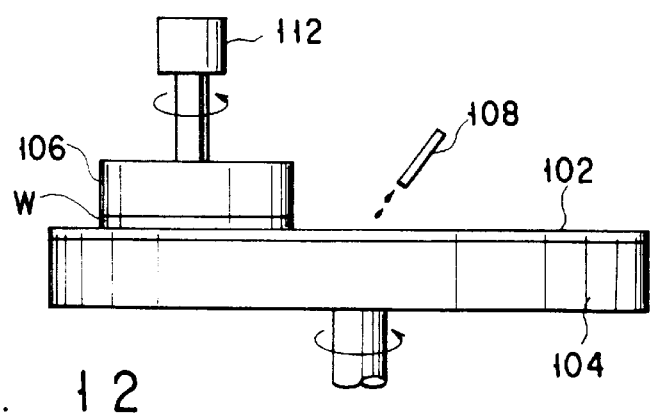
FIG. 12 is a side view showing the CMP type polishing apparatus shown in FIG. 11.

In a modification shown in FIG. 9, the table larger in diameter than the wafer W is used, and a rectifying ring 72 is arranged to surround the wafer W.

The upper surfaces of the wafer W and the ring 72 are aligned. With this structure, the peripheral portion of the target surface of the wafer W is artificially extended to prevent generation of a turbulent flow at the peripheral portion of the wafer W.

In a modification shown in FIG. 10, a region in which the wafer W is polished is surrounded by a partitioning casing 74. A number of intake ports 74a are formed in the side wall of the casing 74. A turbulent flow can be prevented from generating at the peripheral portion of the wafer W by exhausting a plasma flow so as to flow through the intake ports 74a.

Although the plasma polishing apparatus 1 uses an atmospheric-pressure plasma generated in the atmospheric pressure atmosphere, it may have a structure in which the process space is contained in a low-pressure airtight container and a low-pressure plasma is used. In addition, although the plasma generator 20 is of the high-frequency inductive coupling type, various types of plasma generators, e.g., a microwave plasma generator and an ECR plasma generator can be used instead of the plasma generator 20. Further, the present invention can be applied to a case in which the surface of a target object such as an LCD substrate other than a semiconductor wafer is polished.

In the present invention, plasma flowing from a plasma generator onto the target surface of an object such as a wafer is formed into a laminar flow substantially parallel to the target surface upon rotation of the object, and the target surface is polished by the obtained plasma flow. That is, polishing is performed not in a wet atmosphere but in a dry atmosphere, so that a scattering prevention mechanism for a polishing solution and a waste solution recovery mechanism can be omitted, and the apparatus can be simplified. Further, since the target object can be polished without being exposed to a wet atmosphere, the post-process step of the target object can be omitted to decrease the number of process steps.

Furthermore, according to the present invention, since a polishing pad or the like need not be pressed against the target surface of the object, the target surface can be observed in real time by an optical sensor or the like. The end of polishing can be more accurately detected to improve the polishing precision.

As a result, it is possible to introduce a polishing step as one of the steps in a serial-processing sequence performed in a process system of the multi-container type, by employing the polishing apparatus according to the present invention in the process system.

Particularly when polishing is performed by using an atmospheric-pressure plasma generated in the atmospheric pressure atmosphere, a plasma flow can be caused to more efficiently collide with the projecting portions of a target surface, and polishing can be performed at a higher speed with a high degree of smoothness. Since the air tightness of a process container can be reduced, and an exhaust mechanism can be simplified by using the atmospheric-pressure plasma, the initial cost of the apparatus can be reduced. Still further, since polishing is performed in the atmospheric pressure atmosphere, the chucking force of a vacuum chuck can be increased.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A plasma polishing method of polishing a surface of a target object, comprising the steps of:

holding the target object by a table so as to expose the surface of the target object;

converting a process gas into a plasma and supplying the plasma onto the surface of the target object from an outlet port substantially smaller than the surface of the target object; and rotating said table together with the target object at a high speed, such that the plasma is drawn and diffused in laminar flow state on the surface of the target object by a centrifugal force generated upon rotation of the surface, and polishes the surface during diffusion in the surface.

2. The method according to claim 1, further comprising the step of moving said table together with the target object in a direction substantially parallel to the surface of the target object supported by said table during rotation of said table and the target object.

3. The method according to claim 2, wherein said table is moved in accordance with a program inputted in a controller.

4. The method according to claim 2, wherein the surface of the target object is substantially entirely scanned by said outlet port.

5. The method according to claim 2, wherein a relative moving speed between said outlet port and the surface of the target object is reduced nearer a peripheral portion of the surface.

6. The method according to claim 1, wherein the plasma is supplied from said outlet port while said outlet port is arranged within a contour of the surface of the target object.

7. The method according to claim 1, wherein said process gas is converted into the plasma to a substantially atmospheric pressure.

8. The method according to claim 1, wherein the plasma is caused to flow as a laminar flow substantially parallel to one surface of the target object.

9. The method according to claim 1, wherein the plasma is caused to collide with projecting portions on the surface of the target object.

10. The method according to claim 1, wherein the plasma is caused to collide with projecting portions on the surface of the target object.

11. The method according to claim 1, wherein the plasma is generated by means of high-frequency inductive coupling.

12. The method according to claim 1, wherein the plasma is supplied from said outlet port while said table and the target object are rotated at 1,000 rpm at least.

13. The method according to claim 12, wherein the plasma is supplied from said outlet port while said table and the target object are rotated at 1,000 to 7,000 rpm.

14. The method according to claim 12, wherein the plasma is supplied from said outlet port while said table and the target object are rotated at 4,000 rpm at least.

15. The method according to claim 14, wherein the plasma is supplied from said outlet port while said table and the target object are rotated at 4,000 to 6,000 rpm.

16. The method according to claim 1, wherein said outlet port has an area of $1/100$ the surface of the target object at most.

17. The method according to claim 1, wherein the plasma is supplied from said outlet port while a distance between the surface of the target object and said outlet port is set to be 50 mm at most.

18. The method according to claim 1, wherein the plasma is supplied from said outlet port while a distance between the surface of the target object and said outlet port is set to be 5 to 30 mm.

19. The method according to claim 11, further comprising steps of detecting an end point of polishing on the surface of the target object, and stopping the polishing based on the end point.

20. The method according to claim 19, wherein the end point is determined by observing the surface of the target object.

21. The method according to claim 1, wherein a rectifying ring surrounding the target object is arranged so as to form an extended pseudo-peripheral portion of the surface of the target object.

22. The method according to claim 1, further comprising a step of exhausting an air in a direction substantially parallel to the surface of the target object, while polishing the surface.

* * * * *